(12) United States Patent
Knollenberg et al.

(10) Patent No.: US 7,749,782 B1
(45) Date of Patent: Jul. 6, 2010

(54) LASER ROUGHENING TO IMPROVE LED EMISSIONS

(75) Inventors: Clifford F Knollenberg, Fremont, CA (US); David P Bour, Cupertino, CA (US); Christopher L Chua, San Jose, CA (US); Jeng Ping Lu, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 36 days.

(21) Appl. No.: 12/337,491

(22) Filed: Dec. 17, 2008

(51) Int. Cl.
*H01L 21/00* (2006.01)

(52) U.S. Cl. ............... 438/29; 438/964; 257/E25.032; 257/E33.001

(58) Field of Classification Search ............ 438/26, 438/27, 28, 29, 665, 964; 257/82, 432, E25.032, 257/E33.001
See application file for complete search history.

(56) References Cited

U.S. PATENT DOCUMENTS

| | | | |
|---|---|---|---|
| 6,071,795 A | 6/2000 | Cheung et al. | |
| 6,420,242 B1 | 7/2002 | Cheung et al. | |
| 6,562,648 B1 | 5/2003 | Wong et al. | |
| 6,617,261 B2 | 9/2003 | Wong et al. | |
| 7,547,925 B2 | 6/2009 | Wong et al. | |
| 2008/0113463 A1 | 5/2008 | Liu et al. | |
| 2008/0123711 A1 | 5/2008 | Chua et al. | |
| 2008/0144688 A1 | 6/2008 | Chua et al. | |
| 2009/0039367 A1* | 2/2009 | Iso et al. ............ 257/98 | |
| 2009/0090932 A1 | 4/2009 | Bour et al. | |

OTHER PUBLICATIONS

T. Fujii, Y. Gao, R. Sharma, E. L. Hu, S. P. DenBaars, and S. Nakamura, "Increase in the extraction efficiency of GaN-based light-emitting diodes via surface roughening." Applied Physics Letters. 84, (6), Feb. 9, 2004, p. 855.
Chih-Chiang Kao, H.C. Kuo, K.F. Yeh, J.T. Chen, W.L. Peng, H.W. Huang, T.C. Lu, and S.C. Wang, "Light-Output Enhancement of Nano-Roughness GaN Laser Lift-Off Light-Emitting Diodes Formed by ICP Dry Etching," IEEE Photonics Technology Letters, 19, (11), Jun. 1, 2007, pp. 849.
M. K. Kelley, O. Ambacher, B. Dahlheimer, G. Groos, R. Dimitrov, H. Angerer, and M. Stutzmann, "Optical patterning of GaN films," Applied Physics Letters, 69 (12), Sep. 16, 1996, p. 1749.
Bour et al: U.S. Appl. No. 12/337,505 entitled "Selective Decomposition Of Nitride Semiconductors To Enhance LED Light Extraction" filed Dec. 17, 2008.

* cited by examiner

*Primary Examiner*—Quoc D Hoang
(74) *Attorney, Agent, or Firm*—Bever, Hoffman & Harms, LLP; Patrick T. Bever

(57) ABSTRACT

An improved method of forming a LED with a roughened surface is described. Traditional methods of roughening a LED surface utilizes strong etchants that require sealing or protecting exposed areas of the LED. The described method uses a focused laser to separate the LED from the substrate, and a second laser to roughen the LED surface thereby avoiding the use of strong etchants. A mild etchant may be used on the laser roughened LED surface to remove unwanted metals.

19 Claims, 5 Drawing Sheets

US 7,749,782 B1

LASER ROUGHENING TO IMPROVE LED EMISSIONS

CROSS-REFERENCE TO RELATED APPLICATIONS

This application is related to patent application Ser. No. 12/337,505, entitled "Selective Decomposition of Nitride Semiconductors to Enhance LED Light Extraction" which is filed on the same day by the same assignee. The contents of the related application are hereby incorporated by reference in its entirety.

BACKGROUND

In nitride light emitting diode (hereinafter LED) structures, the index of refraction mismatch between GaN and air makes light extraction difficult. In particular, light is often reflected back into the LED structure. One technique used to improve the light extraction efficiency from a LED is to roughen the LED surface to minimize reflectivity at the GaN to air interface.

Current methods of roughening a laser surface utilizes exposing the LED surface to a wet or plasma etch. Such an etch is described in Liu, US Patent application number 20080113463 A1 entitled "Method of Fabricating GaN device with a Laser" which is hereby incorporated by reference. The etching process attacks different crystal planes of the LED surface at different rates resulting in faceted structures ranging between 100 nm and 500 nm wide.

Unfortunately, etchants capable of etching into AlGaN are highly corrosive. Furthermore, to achieve the desired result, several minutes (per batch) of exposure to the etchant is needed. The long period of exposure to a highly corrosive etchant requires sealing of exposed metals portions of the LED to prevent damage to those metal surfaces. Examples of typical etchanting methods include ICP dry etching, immersion in heated potassium hydroxide (KOH) or using a Xe lamp in combination with KOH to produce a photoelectrochemical process (PEC) process. One of the most popular etchants, KOH, not only attacks metals but also attacks photoresist, silicon and even silicon oxide making it a difficult etchant to work with.

Thus an improved method of roughening a LED surface that does not require complicated sealing of all exposed surfaces is needed.

SUMMARY

A method of roughening a LED surface to improve light extraction efficiency of the LED is described. The method uses a first laser in a laser lift off process to separate a LED structure from a substrate. A second focused laser with much smaller spot size produces a series of small pits in the LED surface that was previously attached to the substrate. The series of small pits roughens the surface thereby improving the light extraction efficiency from the LED. Afterwards, a mild etch may be used to remove remaining metals from the LED surface. The described technique avoids using the harsh etches that have traditionally been used to roughen the LED surface.

DETAILED DESCRIPTION

In the description, we describe a method of using a laser to roughen a LED surface to improve light extraction efficiency. The use of a focused laser avoids the need for a harsh etch that has traditionally been used to roughen a surface of the LED.

Figure 1:
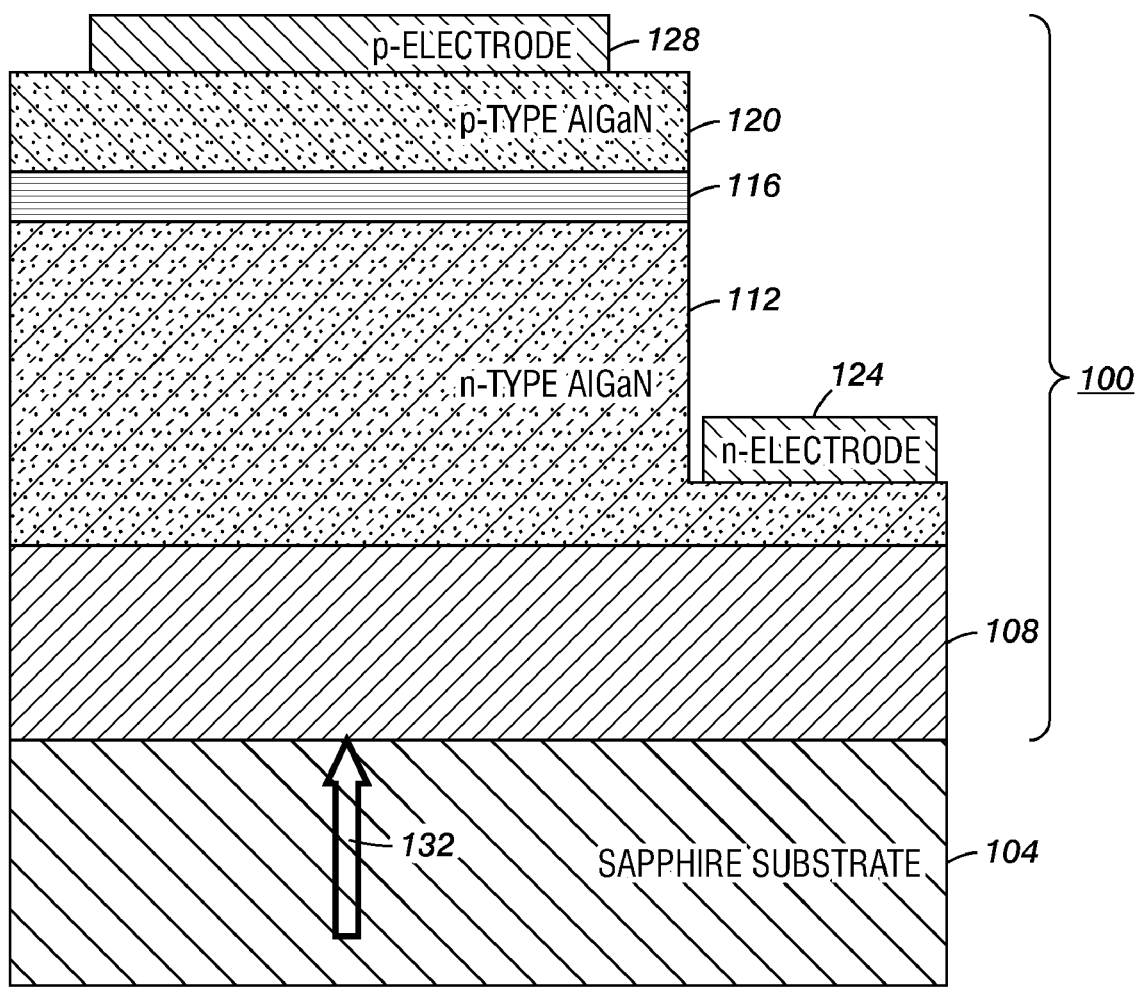
FIG. 1 shows a LED structure formed over a sapphire substrate.

FIG. 1 shows a LED structure 100 formed over a sapphire substrate 104. In FIG. 1, an intermediate template layer 108 typically made up of a nitride compound separates a n-doped region of the LED from the substrate 104. Examples of typical nitride compounds include GaN, AlN, InGaN, AlInGaN, or AlGaN. The template layer 108 helps match the lattice structure of the n-doped cladding to the substrate lattice structure. Typically, substrate 104 is a sapphire substrate.

The LED shown in FIG. 1 includes a n-doped layer 112, a multiple quantum well active layer 116 and a p-doped cladding layer 120 all formed over template layer 108. A n electrode 124 and a p electrode 128 provides current that flows into the active layer 116 to generate spontaneous emission of light. When the active region is a AlGaN active region, the light output is in the UV range at wavelengths between 200 nm and 365 nm.

Figure 2:
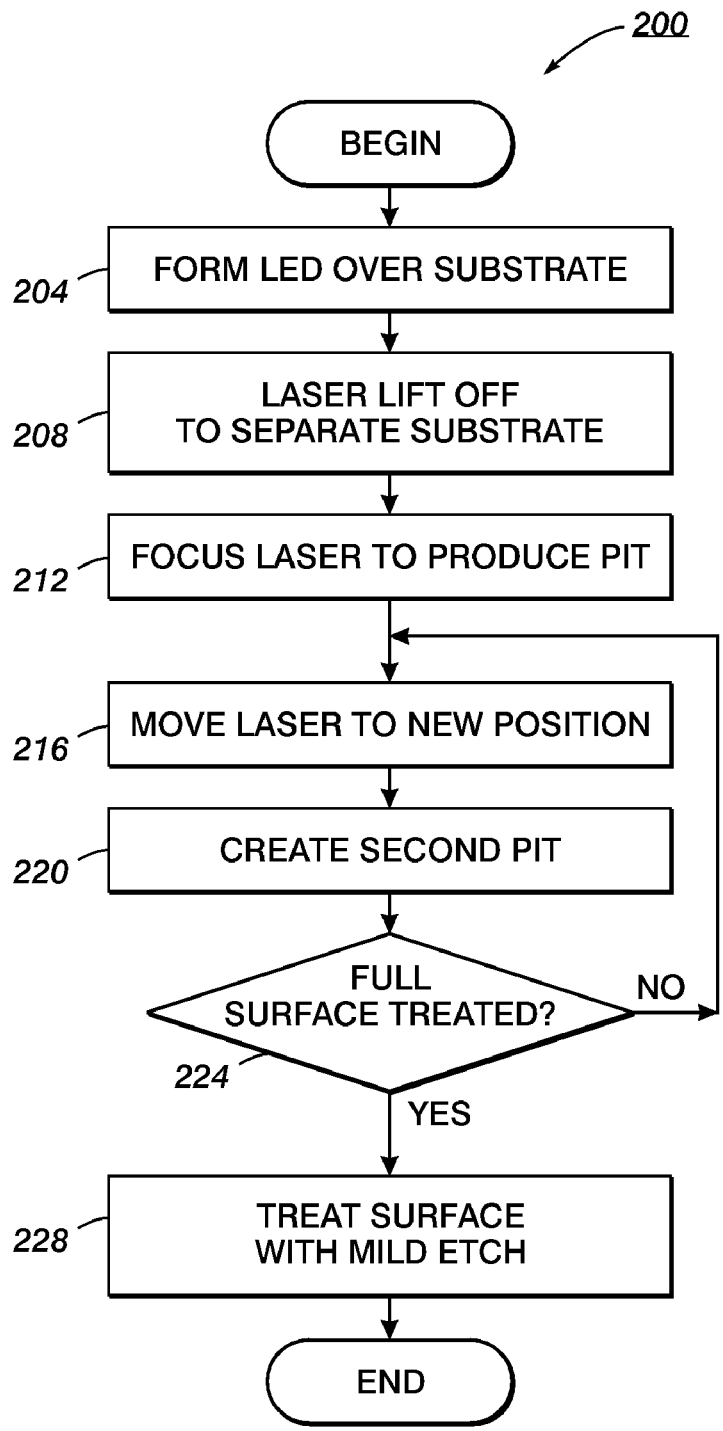
FIG. 2 shows a flow chart describing the operations used to separate a LED from a substrate and to roughen the surface of the LED.

FIG. 2 shows a flow chart 200 that describes the process of removing the sapphire substrate using a laser lift off process and roughening the laser lift off surface of the LED to improve light extraction from the LED structure in the direction 132 of FIG. 1. Box 204 of FIG. 2 describes forming a LED structure similar to that shown in FIG. 1 over a sapphire substrate.

In order to separate the LED structure from the sapphire substrate, box 208 shows use of a laser lift off process (hereinafter LLO process). In the LLO process, a defocused, homogenous Laser lift off laser (LLO laser) such as an excimer laser in the desired frequency range is used. Typically the spot size of the laser at the laser lift off surface exceeds 1 mm² to enable coverage of the entire area between the substrate and the LED, however smaller spot sizes may be used if they are stitched together properly. In laser lift off, it is strongly preferred that the light energy be homogenous, or spread uniformly across the laser spot area, as a non-uniform light intensity will result in decomposition region of non-uniform thickness.

Figure 7:
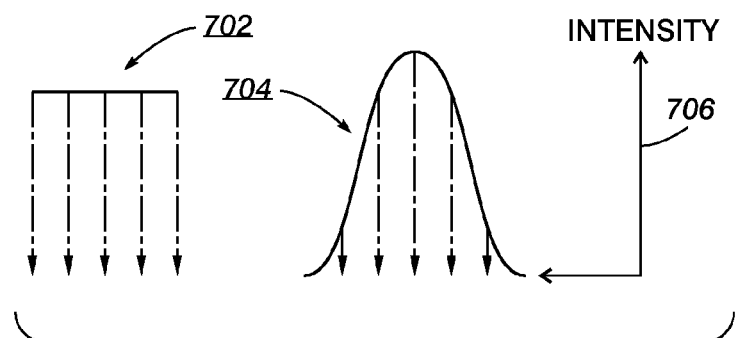
FIG. 7 shows example intensity patterns in laser spots used for laser lift off and to roughen a LED surface.

FIG. 7 illustrates the difference between a laser spot with a non-uniform light intensity and laser spot with a homogenous light intensity distribution. A cross-section of the light energy density of a homogenous laser spot 702, and a non-uniform laser spot 704 are shown, with the y-axis 706 representing light intensity. Typically, beam uniformity is a characteristic of the laser source, however by inserting a beam homogenizer optic which is typically an array of lenslets, the spot uniformity can be improved. A non-uniform beam can typically be achieved by inserting a single lens and using this to focus the beam into a small spot. As used herein, a homogenous beam is one where 80% of the spot area does not vary in intensity by +/−10%. Example laser intensity distribution in Laser spot 702 is an example of the uniform light intensity across a laser spot preferred for laser lift off.

The LLO laser is adjusted such that sufficient power per unit area is delivered to decompose a layer of the semiconductor into nitrogen gas and an alloy of the constitutive metals. This process typically results in the vaporization of the nitrogen in the LLO absorption layer and the brief melting, but not vaporization, of the metallic elements in the LLO absorption layer. As used herein, the LLO absorption layer is defined as the layer that absorbs most of the energy from the LLO laser. Typical power densities to achieve the liberation of nitrogen gas and the melting of the constitutive metals are between 600 mJ/cm$^2$ and 1000 mJ/cm$^2$. Although power densities higher than this can be used to decompose the semiconductor, the excess energy may result in structurally damaged films.

As used herein, LLO surfaces shall be defined as surfaces that were previously attached but were separated due to a laser lift off process. Thus when the laser is tuned and the materials selected such that separation occurs at the template layer 108 and n-doped layer 112 interface, the LLO surface of the LED is the surface of the n-doped layer 112 formerly attached to template layer 108. Alternately, when the laser is tuned and the materials selected such that separations occurs at the template layer 108 and substrate 104 interface, the LLO surface of the LED will be the bottom surface of template layer 108.

In a typical laser lift off process (LLO) laser energy is used to decompose a specific semiconductor layer within an epitaxially grown semiconductor heterostructure. By decomposing the strong chemical bonds that link the semiconductor heterostructure together, the structure may be separated into two pieces. The separation usually occurs between the epitaxially grown LED heterostructure and the substrate it is grown on, but the separation may also occur within the epitaxially grown heterostructure. The wavelength of the LLO laser should be such that the energy of LLO laser photons is greater than the band gap energy of the LLO absorption layer in order for proper laser energy absorption and LLO to occur. The absorption of the laser energy results in highly localized heating which breaks the chemical bonds of the semiconductor material, or decomposes the semiconductor. By properly selecting the laser wavelength, illumination direction, and band gap of the LLO absorption layer, a specific layer within the multi-layer LED heterostructure can be targeted for decomposition. Such a laser lift off process is described in Cheung et al, U.S. Pat. No. 6,420,242 B1 entitled "Separation of Thin Films with Transparent Substrates by Selective Optical Processing" which is hereby incorporated by reference in its entirety.

After separation and removal of the substrate from the LED structure, a laser roughening process occurs. Box 212-220 shows a laser roughening process in which the template layer 108 is exposed to a second laser, a "roughening" laser, to create "pits" in the laser lift off (LLO) surface. As used herein, "pit" is broadly defined to include any indentation in the material caused by the laser. As previously described, the LLO surface of the LED is defined as the surface of the LED from which the substrate was removed via a laser lift off process; thus the LED laser lift off surface may be either a surface of the n-doped layer 112 or a bottom surface of template layer 108 depending on where the substrate and the LED structure separates.

In order to roughen the surface, the roughening laser delivers significantly more power per unit area than the LLO laser, usually with a non-uniform light intensity across the spot. Typically, the roughening laser delivers an energy density (power per unit area) in excess of 2 J/cm$^2$. The roughening laser is focused to form a small spot size having an area less than 0.01 mm$^2$ to avoid creating large area pits. Unlike the laser spots preferred for LLO, a non-uniform light intensity is preferred for roughening because a non-uniform light intensity will result in a non-uniform decomposition layer thickness, or surface roughness. An example non-uniform laser intensity distribution is shown in example laser spot 704, although it should be understood that other non-uniform laser intensity distributions may also be used.

Figure 3:
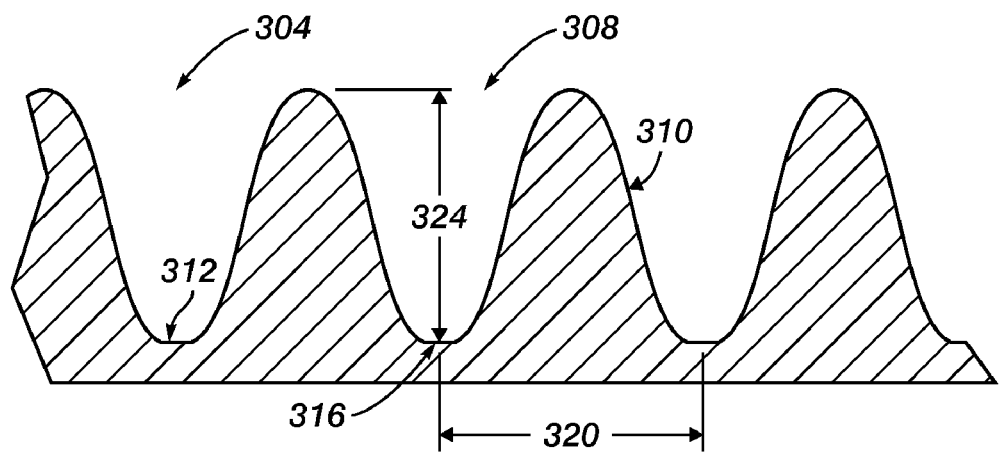
FIG. 3 shows a side cross sectional view of the pits created by a roughening laser.

The semiconductor absorption layer absorbs the incident roughening laser light causing a rapid temperature increase that breaks the chemical bonds of the semiconductor and decomposes it into nitrogen gas and a mixture of the liquid metals. The non-uniform distribution of light intensity within the spot results in variations in heating and absorption depth in the LED heterostructure. Regions of the absorption layer receiving a higher illumination density will undergo a greater temperature increase. Furthermore in such regions, the light energy will penetrate deeper and decomposition will occur deeper in the LED. These regions will not only undergo nitrogen gas vaporization, but also vaporization of the various constituent metals as well. This process can produce a curved pit shape as illustrated in FIG. 3.

The surface roughness produced by the roughening laser defeats losses due total internal reflection within the LED structure. The exact requirements necessary to defeat total internal reflection are varied, however feature sizes ranging from 100 nm to 2 microns have been show to overcome internal reflection and enhance light extraction from LEDs.

Various types of lasers may be used for a roughening laser. The frequency of the laser should be selected such that the energy will be absorbed by the LLO surface of the LED. In one embodiment, the laser is a frequency quadrupled Nd: YAG laser outputting light at a wavelength near 266 nm. Experimental results show that the thin film of Al/Ga metal that typically coats the LLO surface of the LED after a LLO procedure does not appreciably change the laser spot size (or other parameters) of the roughening laser at the LLO surface. The 266 nm wavelength has been show to work with a wide range of aluminum contents. Ideally, this process works best when the ratio of Aluminum to Gallium is less than 57 Al to 43 Ga, although we have found it possible to pit the surface of an AlGaN alloy with a ratio of 7:3 Al to Ga with a 266 nm laser. Focused Excimer lasers outputting 248 nm have also been shown to work in pitting AlGaN layers with up to 70% Al content, and a 193 nm excimer laser would pit films with up to 100% Al (AlN).

In box 212, the focused laser is pulsed to create a first pit. In one embodiment, each pulse of the focused pulsed second laser produces a pit or an inverted "volcano" shape in the laser lift off surface. In order to create a "rough" surface, many such pits are needed. In box 216, relative motion between the roughening laser and the substrate moves the laser to a second position over the LLO surface of the LED. Typically the relative motion is accomplished by moving the second laser along a line or other predetermined pattern.

In box 220, the roughening laser is pulsed again to create a second pit. The position of the second pit is typically in such close proximity to the first pit that there is no smooth or unaffected area between the adjacent pits. The process is repeated, typically by moving the roughening laser along a pattern (such as a line and subsequently along an adjacent parallel line), until it is determined in box 224 that the entire LLO surface to be roughened has been sufficiently pitted or otherwise roughened.

Although the roughening process vaporizes some metal, it does not vaporize all the metal. Thus, the LLO process along with the roughening process typically leaves behind a highly reflective gallium and aluminum metal residue over the LLO surface. The metal residue should be removed to reduce reflectivity and allow light from the LED active region to exit through the LLO surface. One method of removing the metallic residue is via a mild etch such as a hydrochloric acid (HCl) etch. Box 228 shows using a HCL etch to remove the metallic residue. The HCL etch is typically done with a HCL concentration of 1:1 HCl:$H_2O$ and for a period of time less than 5 minutes. The HCL etch is much milder than the KOH etch traditionally used to roughen a surface, thus the HCL etch does not require protection of all the exposed contact surfaces.

Figure 4:
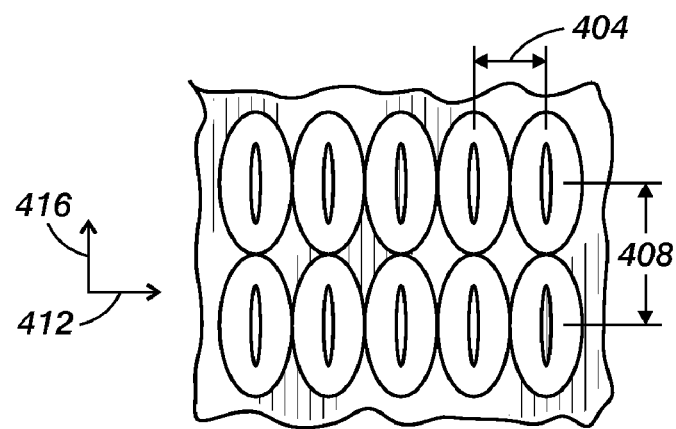
FIG. 4 shows a top view of example pits created by a roughening laser.

FIG. 3 shows a side cross section of a resulting pitted laser lift off surface. FIG. 4 shows an example top view of such a surface. As shown in FIG. 3, each pit 304, 308 typically has somewhat gently curved sides 310 that do not coincide with crystal planes. An approximately flat bottom 312, 316 typically forms at the bottom of each pit 304, 308. Typical separation distances 320 between adjacent pit centers is usually between 10 to 20 microns. Typically, pit centers correspond to the center of a laser pulse where the light intensity is greatest, thus laser pulse spacing is typically also between 10 to 20 microns. Typical pit depths 324 range between 100 and 2000 nm. The shape of the pit is related to the non-uniformity of the light intensity within the laser spot. Controlling this non-uniformity allows control of the pit profile.

FIG. 4 shows an example top view of the pitted LLO surface. Each laser pit 304, 308 typically has a somewhat oval shape although other shapes are also possible, and likely due to variations in laser quality and optics. In one embodiment, the separation distance 404 between adjacent laser pits along the short axis 412 is approximately 10 microns while the separation distance 408 along the long axis 416 is approximately 20 microns although these dimensions may vary widely depending on the desired surface roughness.

Figure 5:
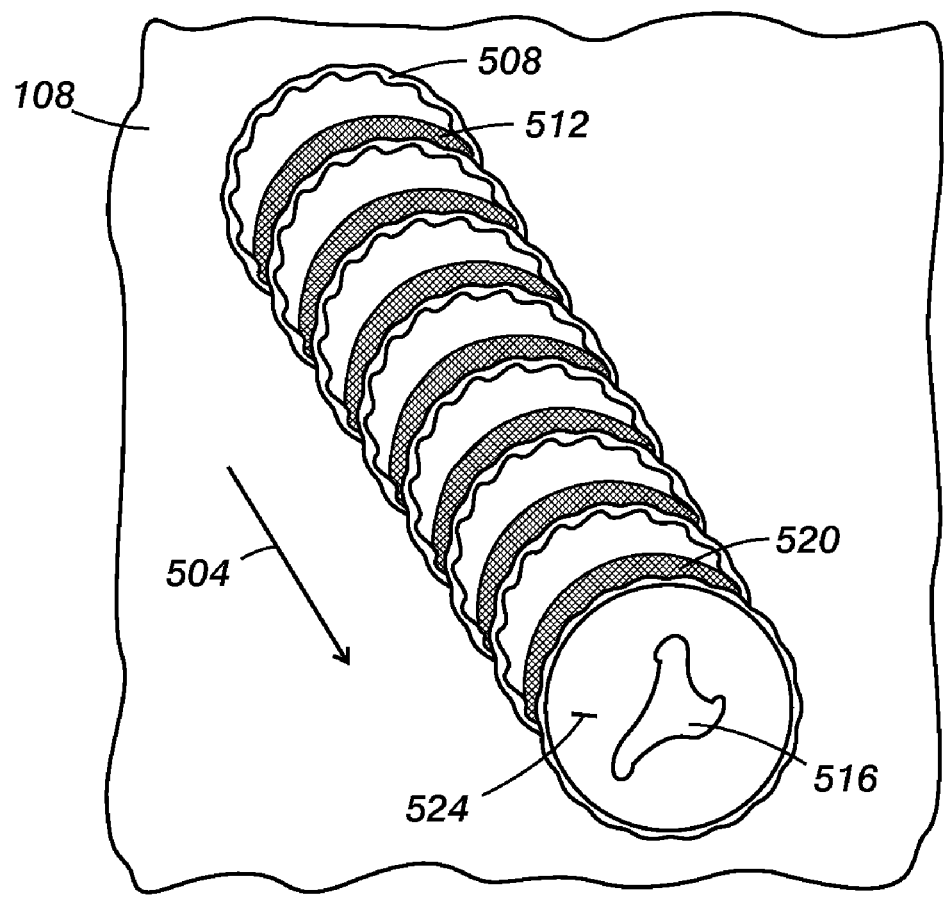
FIG. 5 shows a top view of example closely spaced pits created by a roughening laser.

Alternate spot or pit arrangements and spacing may also be used. In one embodiment, the laser spots substantially overlap. FIG. 5 is a top view of a series of laser spots that are placed so closely together along a line 504, that the laser spots substantially overlap. Each pit is typically surrounded by a "heat affected zone", herein defined as a region in which the temperature is elevated, but the nitrogen vaporization and metal melting is incomplete or at least inhomogeneous, preventing a smooth surface from forming. The outer edge of the first heat affected zone 508 of AlGa metal from the first laser pit is shown at a first end of a series of such heat affected zones along line 504. A second pit is formed within the outer perimeter of the first pit corresponding to the first laser spot such that the outer edge of the second heat affected zone 512 forms a ring of Al Ga metal that is almost parallel, shifted but not quite in a concentric ring adjacent to the first heat affected zone. The laser pulses continue along line 504 until the last laser pulse in the line is formed. As illustrated, the last pit centered at point 516 forms the last heat affected zone 520 of AlGa metal. Experimental results show that an AlGa surface feature forms near the center of spot 516. The surface feature has a somewhat higher reflectivity than the approximate surrounding ring of AlGa metal 524.

Figure 6:
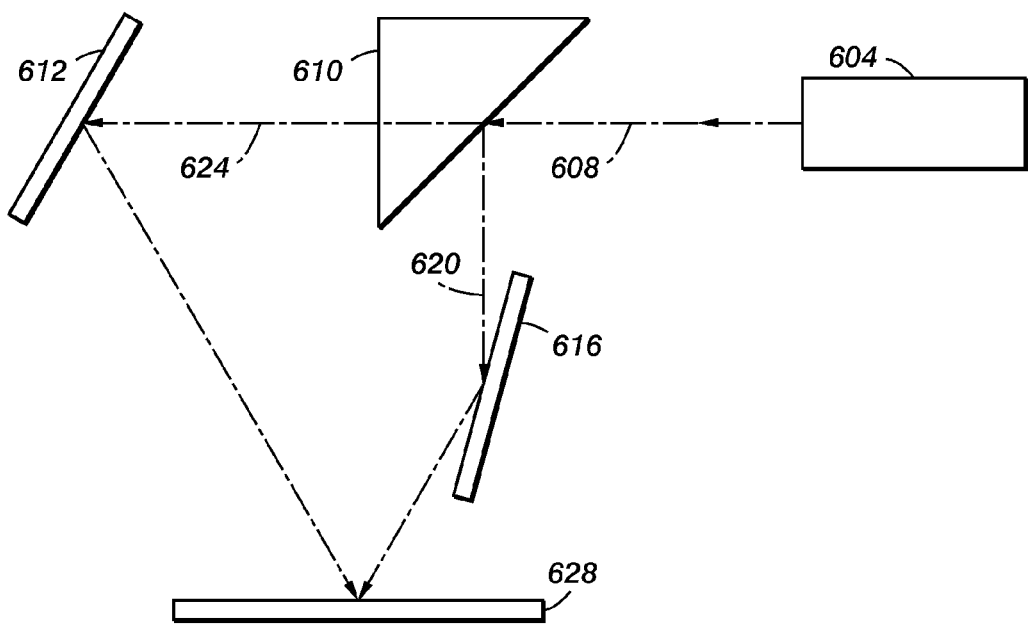
FIG. 6 shows using a system used to create a laser interference pattern such that regions of constructive interference forms lines that roughen a LED surface.

Although a line of pits formed by an approximately linear relative motion of a roughing laser and a LLO surface has been shown, other patterns to roughen a surface are also possible. FIG. 6 shows a setup to create a line pattern using a laser interference pattern. In FIG. 6 a laser source 604 directs laser light 608 through a beam splitter 610. Mirrors 612, 616 direct the spit beams 620, 624 to recombine back at the LLO surface 628, typically an AlGaN or GaN surface where the recombined beams create a laser interference pattern. The interference pattern includes regions of constructive interference where the roughening laser intensity is sufficient to decompose the LLO surface material. Typically, this means decomposing AlGaN or GaN material into nitrogen gas and vaporizing some but not all Al and/or Ga material. The interference pattern also includes regions of destructive interference where the roughening laser intensity is weak and does not pit or significantly alter the LLO surface material. The substrate or laser system may be rotated to create intersecting lines thereby creating a roughened surface.

While the above embodiments are envisioned for LEDs operating in the UV region of the electromagnetic spectrum, they may also be useful at longer wavelengths as permitted by the nitride semiconductor material system. This may include wavelengths into the visible spectrum such as violet, blue, and green light, or the wavelength spectrum extending from 365 nm to 550 nm. LEDs as this wavelength typically employ Ga and In rich alloys of AlGaN, InGaN, AlInN, and AlInGaN, and may include InN and GaN as well. The residual surface metal combinations left after the roughening process on these materials may require different etch chemistries to remove, however, HCl is know to be effective at removing Ga metal. Also, in longer wavelengths LEDs, substrates of SiC or GaN may be substituted for the sapphire substrate we describe.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of roughening a LED surface to improve light extraction efficiency comprising the operations of:
   forming a LED structure over a substrate;
   using a first laser to generate sufficient heat between the LED structure and the substrate to cause separation of the LED structure from the substrate in a laser lift off process;
   using a focused second laser with a spot size less than 0.01 $mm^2$ to produce a series of small pits in a surface of the LED structure that was previously attached to the substrate thereby creating a pitted surface.

2. The method of claim 1 wherein the second laser is pulsed, the second laser gradually moved across the surface such that the pits approximately overlap.

3. The method of claim 2 wherein the second laser is a Nd:YAG laser.

4. The method of claim 3 wherein the Nd:YAG laser is frequency quadrupled to achieve wavelength near 266 nm.

5. The method of claim 4 wherein the LED structure includes at least one layer having a ratio aluminum to gallium that is less than 7 to 3.

6. The method of claim 4 wherein the LED structure is an alloy of at least one of GaN, AlN, InN, AlGaN, InGaN, or AlInGaN.

7. The method of claim 3 wherein the first laser used for laser lift off is an excimer laser.

8. The method of claim 1 wherein a depth of each pit is approximately between 100 nm and 2000 nm.

9. The method of claim 1 wherein the first laser used for laser lift off is defocused to create a spot size that exceeds 0.01 mm² such that the power per unit area is less than 2 J/cm².

10. The method of claim 1 wherein the second laser delivers a power per unit area greater than 2 J/cm².

11. The method of claim 1 further comprising the operation of:
exposing the pitted surface to an acid etch, the acid etch to remove a metallic residue that remains on the pitted surface.

12. The method of claim 11 wherein the acid used to perform the acid etch is a hydrochloric acid.

13. The method of claim 12 wherein the HCL concentration in the hydrochloric acid etch is between 50% and 5%.

14. The method of claim 11 wherein the acid is a weak acid such that the time of acid exposure and the strength of the acid used does not require sealing of exposed metal surface of the LED structure.

15. The method of claim 1 wherein the pit from the second laser is created from constructive interference in an interference pattern.

16. The method of claim 1 wherein the second laser has a non-uniform light intensity distribution over the laser spot area.

17. The method of claim 16 wherein the non-uniform light intensity distribution decomposes the LED material non-uniformly over the laser illuminated area.

18. A method of roughening a LED surface to improve light extraction efficiency comprising the operations of:
forming a n-doped layer over a substrate,
forming an active region of the n-doped layer, the active region to emit light;
using a first defocused laser delivering a power per unit area of less than 2 J/cm² to separate the n-doped layer from the substrate in a laser lift off process and to create a laser lift off surface of the n-doped layer;
using a second focused laser delivering a power per unit area in excess of 2 J/cm² to pit the laser lift off surface of the n-doped layer.

19. The method of claim 18 further comprising the operation of:
exposing the laser lift off surface of the n-doped layer to a HCL etch, the HCL etch to remove any excess metal that may remain after expose to both the first laser and the second laser.

* * * * *